(12) United States Patent
Martin

(10) Patent No.: US 6,489,778 B2
(45) Date of Patent: *Dec. 3, 2002

(54) FAULT CURRENT RECOGNITION IN CONTROL UNITS

(75) Inventor: Edmund Martin, Schwalbach (DE)

(73) Assignee: Mannesmann VDO AG, Frankfurt (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/429,546

(22) Filed: Oct. 28, 1999

(65) Prior Publication Data

US 2001/0030542 A1 Oct. 18, 2001

(30) Foreign Application Priority Data

Oct. 30, 1998 (DE) .......................... 198 50 001

(51) Int. Cl.⁷ .................. G01R 31/00; G01R 31/14; G01R 31/08; H02M 3/18
(52) U.S. Cl. .................. 324/500; 324/511; 324/522; 324/537; 324/133; 361/78; 361/79; 361/82; 361/84; 361/87
(58) Field of Search ................. 324/500, 511, 324/522, 537, 133; 361/78, 79, 82, 84, 87

(56) References Cited

U.S. PATENT DOCUMENTS

| 3,973,171 | A | * | 8/1976 | Howell ..................... 361/87 X |
| 4,811,136 | A | * | 3/1989 | Jones et al. ................... 361/79 |
| 5,644,463 | A | * | 7/1997 | El-Sharkawi et al. ......... 361/94 |
| 5,796,259 | A | * | 8/1998 | Dickmander ................. 324/522 |
| 5,910,875 | A | * | 6/1999 | Tian et al. .................... 361/78 |
| 6,222,374 | B1 | * | 4/2001 | Shoemaker ................. 324/537 |

* cited by examiner

*Primary Examiner*—N. Le
*Assistant Examiner*—Wasseem H. Hamdan
(74) *Attorney, Agent, or Firm*—Martin A. Farber

(57) ABSTRACT

A method of reconizing a fault current in a control unit and to a control unit having a circuit for recognizing the fault current. According to the invention, a current flowing into the control unit which could cause the control unit to be damaged or to operate incorrectly is detected and a fault signal is produced depending on the current detected, the fault signal causing the load or the current supply for the control unit to be switched off, for example.

8 Claims, 2 Drawing Sheets

FAULT CURRENT RECOGNITION IN CONTROL UNITS

FIELD AND BACKGROUND OF THE INVENTION

The invention relates to a method of recognizing a fault current in a control unit and to a control unit having a circuit for recognizing a fault current in a control unit.

Control units are known which are connected to a voltage supply and are supplied with input signals, the input signals supplied being used to switch on or switch at least one load connected to an output of the control unit. The load is arbitrary, so that pure resistive loads such as lamps can be involved here. Also, inductive and capacitive or other complex loads, such as solenoid valves, are conceivable as well.

To drive the load, the control unit comprises a driver which is actuated, for example, by a microprocessor integrated in the control unit and thus supplies a current to the load, which is connected to ground, for example. This means that, if the control unit and also the load are operating correctly, a current flows (depending on the polarity) from the control unit into the load, for example.

In incorrect operation, the current may not flow in the desired direction, but instead—in the case just outlined—a current may flow into the control unit, for example owing to a short circuit. This is undesirable because this fault current can cause damage to the control unit and its components or can cause the control unit to operate incorrectly.

To eliminate this problem, it is known to connect a diode in a series with the driver of the control unit, said diode being connected counter to the direction of the fault current and preventing the fault current from flowing. However, such a diode has the disadvantage that it becomes hot during operation of the control unit and the produces a high power loss, which is undesirable.

SUMMARY OF THE INVENTION

The invention is therefore based on the object of effectively detecting the occurrence of a fault current and of protecting the control unit against such a fault current without producing a power loss.

The invention proposes a method of recognizing a fault current in a control unit, in which a current flowing into the control unit via the output is detected and a fault signal is produced depending on the current detected. A fault current flowing into the control unit can be detected without any power loss, which does not impair the detection per se, so that the fault signal produced also brings about a fast reaction.

In a development of the invention, the load and/or the current supply for the control unit is switched off when the fault signal occurs. Hence, if a fault current flowing into the control unit has been detected in good time, this fault current can cause the load to be switched off so as to prevent further damage to the control unit, if the load is the fault source. If this is not the case (for example if there is a short circuit at the output and the load itself is operating correctly), the current supply for all the control units can also be switched off.

In addition or as an alternative, it is naturally also possible for the fault signal to be evaluated. Thus, for example, fault currents flowing briefly into the control unit, which, owing to their brevity, are not harmful, can be overlooked; if the fault currents are present for longer than a predefinable time interval, however, this is recognized as a fault situation and there is an appropriate reaction. Similarly, the level of the current flowing into the control unit can be detected and assessed. In this case, too, slight fault currents can be overlooked again, whereas fault currents above a predefinable magnitude cause a reaction and are evaluated to prevent damage to the control unit.

BRIEF DESCRIPTION OF THE DRAWING

There are other advantageous refinements, which are described below and shown in.

DETAILED DESCRIPTION OF THE PREFERRED EMBODIMENT

Figure 1:
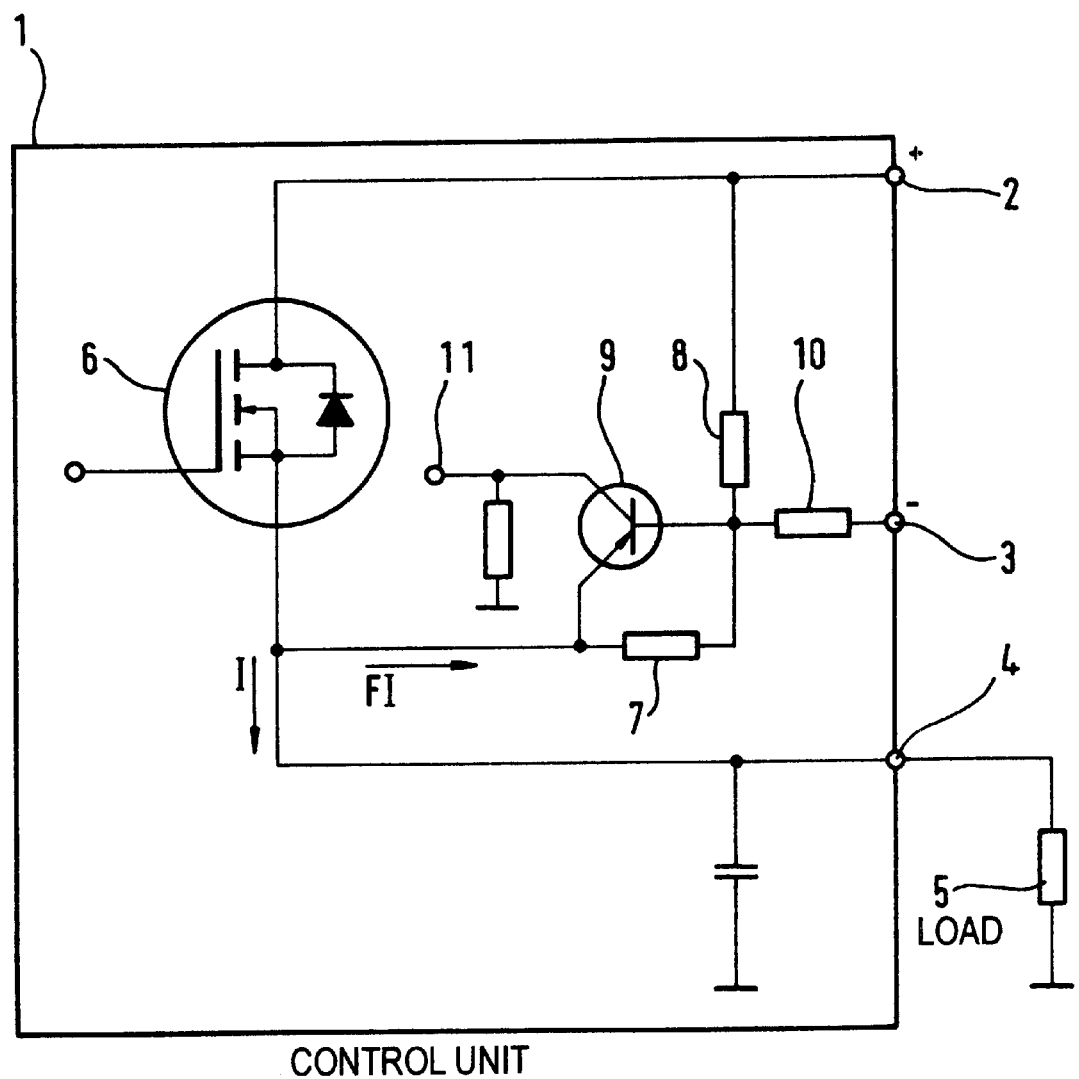
FIG. 1 which is a circuit diagram of a control unit.

FIG. 1 shows at least part of a control unit 1 which receives its voltage supply (in this case a DC voltage supply) via a positive connection 2 and a negative connection 3 (ground). The control unit 1 has inputs (not shown) via which the control unit 1 is supplied with input signals for further processing. A load 5, which is connected to ground, is connected to an output 4 of the control unit 1.

The control unit 1 also contains a driver 6 which is designed as a high-side driver, for example. This driver 6 is actuated by a processor (microprocessor) or the like, which is not shown, in the control unit 1 such that the load 5 is switched on when a current I flows from the positive connection 2 to ground via the load 5. If the load 5 is to be switched off, the driver 6 is actuated such that no current I flows.

According to the invention, the control unit 1 has a circuit for recognizing a fault current, this circuit being supplied with a current which flows into the control unit 1 via the output 4, is directed against the direction of flow (shown in the figure) of the current I and can be detected by said circuit, and a fault signal being produced by the circuit depending on the current detected. A fault current (denoted FI) flowing into this circuit results, via resistors 7, 8 connected as a voltage divider, in a voltage at a base of a transistor 9, which is designed as a simple PNP transistor. This voltage produced by the voltage divider 7, 8 is additionally magnified by a ballast resistor 10 connected to the negative connection 3, so that the transistor 9 can react in good time when a fault current FI occurs. This means that, in the event of a fault current FI occurring, the collector of the transistor 9 has a fault signal available in good time at a fault signal output 11, said fault signal either being supplied to the processor in the control unit 1 for further evaluation or being fed out of the control unit 1 and evaluated in order to implement the measures already mentioned for preventing damage to the control unit 1. Processing the fault signal within the control unit 1 has the advantage that the control unit 1, including the circuit for recognizing the fault current, is of compact design.

It is particularly advantageous if the circuit for recognizing the fault current is arranged physically close to the driver 6 of the control unit 1, so that the components involved are at the same temperature, which means that different temperatures of the driver 6, on the one hand, and of the circuit (resistors 7 and 8, transistor 9, ballast resistor 10), on the other hand, cannot cause a delay in production of the fault signal.

Figure 2:
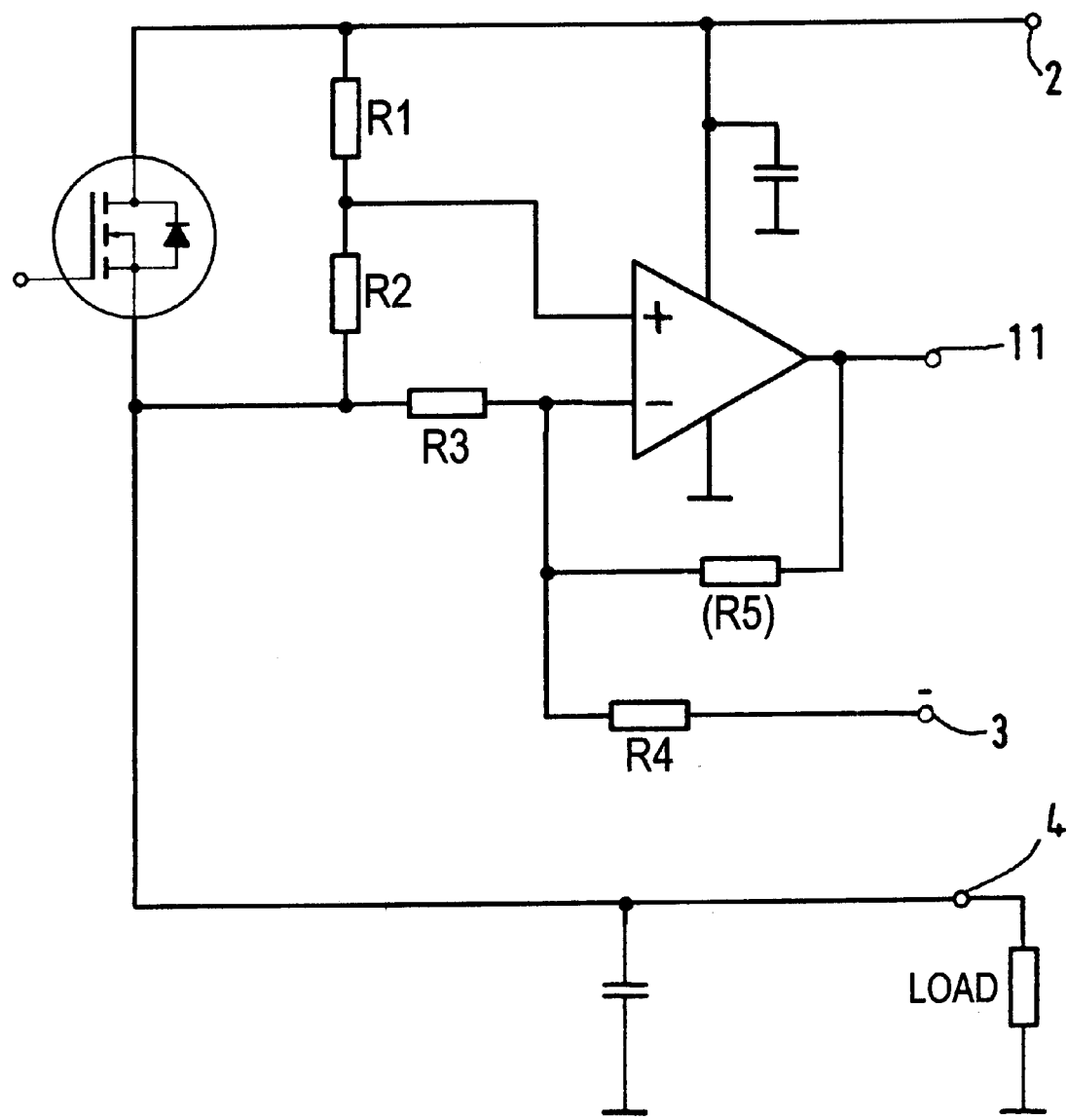
FIG. 2 which is a circuit diagram including an operational amplifier for the control unit of FIG. 1.

Instead of the circuit shown in the figure, other electronic components to which the fault current FI is supplied can also be used, these components producing a fault signal at the fault signal output 11 depending on the fault current FI supplied. In this case, an appropriately connected operational amplifier (shown in FIG. 2) is conceivable, for example, which, on the one hand, has a predefined current impressed on it, and whose second input is supplied with the fault current FI. As soon as the supplied fault current FI exceeds the impressed current (which can also be zero, for example), the operational amplifier produces the fault signal at its fault signal output.

The sensitivity of the circuit for recognizing the fault current FI can be set by means of the current impressed on the operational amplifier or using the ballast resistor 10.

A particularly important feature is the use of the control unit according to the invention or of the method according to the invention for recognizing a fault current in the automotive sector, particularly in automobiles or goods vehicles. This is because, with these applications, components which produce a power loss and hence heat are undesirable because such a power loss, especially when a multiplicity of control units present in modern vehicles are used, causes fuel consumption to be increased. Furthermore, in the automotive sector, heat losses produced are difficult to dissipate because the measures needed for this (for example heat sinks or cooling fans) unnecessarily take up space or give rise to additional costs.

LIST OF REFERENCE NUMERALS

1. Control unit
2. Positive connection
3. Negative connection
4. Output
5. Load
6. Driver (high-side driver)
7. Resistor
8. Resistor
9. Transistor
10. Ballast resistor
11. Fault signal output

I claim:

1. A method of recognizing a fault current in a control unit having an output connected to a load which can be switched by a switch such that the load is enabled or disabled, wherein the switch is located in the control unit along a path of current flow through the control unit and into the load, the method including steps of controlling the switch by the control unit, detecting within the control unit a current flowing into the control unit via the control unit's output, producing a fault signal depending on the fault current detected in the control unit, and wherein the detecting step is accomplished by use of a transistor circuit located within the control unit and comprising a transistor and a voltage divider establishing a voltage at a terminal of the transistor, the switch comprises a driver, the voltage divider is connected between terminals of the driver, and a further terminal of the transistor produces the fault signal and is available for use via a processor for control of the driver.

2. The method as claimed in claim 1, wherein the load is switched off when the fault signal is produced.

3. The method as claimed in claim 2, further comprising the step of switching off a current supply for the control unit when the fault signal is produced.

4. The method as claimed in claim 1, wherein the current flowing into the control unit is switched off when the fault signal is produced.

5. The method as claimed in claim 1, wherein the current flowing into the control unit is supplied to the transistor via the voltage divider, the fault signal being produced by the transistor after it has been switched on.

6. A control unit (1) having a circuit for recognizing a fault current (FI) in the control unit (1), the control unit having an output (4) connected to a load (5) which can be switched by a switch such that the load is an enabled or disabled, wherein the switch is located in the control unit along a path of current flow through the control unit and into the load and is controlled by the control unit (1), wherein the fault current (FI) flowing into the control unit (1) via the control unit's (1) output (4) is supplied to the circuit and is detected by the circuit, and a fault signal is produced by the circuit depending on the fault current (FI) detected in the control unit (1), and wherein detection of the fault current is accomplished by use of a transistor circuit located within the control unit and comprising a transistor and a voltage divider establishing a voltage at a terminal of the transistor, the switch comprises a driver, the voltage divider is connected between terminals of the driver, and a further terminal of the transistor produces the fault signal and is available for use via a processor for control of the driver.

7. The control unit (1) as claimed in claim 6, wherein the circuit is arranged physically close to the driver (6) of the control unit (1).

8. A method of recognizing a fault current in a control unit having an output connected to a load the load being switchable by a switch such that the load is enabled or disabled, wherein the switch is located in the control unit along a path of current flow through the control unit and into the load, the method comprising the steps of:

controlling the switch by the control unit, detecting within the control unit a current flowing into the control unit via the control unit's output, producing a fault signal dependent on the detected current in the control unit, and wherein the detecting step is accomplished by use of a transistor circuit located within the control unit and comprising a transistor and a voltage divider establishing a voltage at a terminal of the transistor, the switch comprises a driver, the voltage divider is connected between terminals of the driver, and a further terminal of the transistor produces the fault signal and is available for use via a processor for control of the driver.

* * * * *